United States Patent
Tomikawa

Patent Number: 5,712,598
Date of Patent: Jan. 27, 1998

[54] DRIVING APPARATUS FOR ELECTROSTATIC CONVERTING MEANS

[76] Inventor: Yoshiro Tomikawa, 1-7 Yukigaya, Otsuka-Cho, Ota-ku, Tokyo, Japan

[21] Appl. No.: 578,352

[22] Filed: Dec. 21, 1995

[30] Foreign Application Priority Data

Dec. 28, 1994 [JP] Japan .................................. 6-340133
Mar. 9, 1995 [JP] Japan .................................. 7-079569

[51] Int. Cl.⁶ .................................................. H03B 5/32
[52] U.S. Cl. ........................................ 331/105; 331/158
[58] Field of Search .................. 331/116 R, 116 FE, 331/158, 105

[56] References Cited

U.S. PATENT DOCUMENTS

| | | | |
|---|---|---|---|
| 3,731,230 | 5/1973 | Cerny, Jr. | 331/158 |
| 4,227,158 | 10/1980 | Schroeder et al. | 331/158 |
| 4,734,659 | 3/1988 | Tanaka et al. | 331/139 |
| 4,782,309 | 11/1988 | Benjaminson | 331/139 |
| 4,888,566 | 12/1989 | Bong et al. | 331/158 |
| 5,047,734 | 9/1991 | Newell et al. | 331/158 |
| 5,113,153 | 5/1992 | Soyuer | 331/61 |
| 5,136,263 | 8/1992 | Lane | 331/158 |

*Primary Examiner*—Siegfried H. Grimm
*Attorney, Agent, or Firm*—Guy W. Shoup; Patrick T. Bever

[57] ABSTRACT

A driving circuit and a Self-oscillating circuit incorporating a piezoelectric oscillator having one terminal connected to ground. In the driving circuit, an alternating driving power is supplied to a first terminal of the piezoelectric oscillator, and the second terminal of the piezoelectric oscillator is connected to ground. The damping capacitance of the piezoelectric oscillator is effectively canceled by connecting the first terminal to an input of an amplifier, and forming a feedback loop by connecting an output of the amplifier to the input through a electrostatic capacitance whose value is 1/N times the damping capacitance of the piezoelectric oscillator, where the amplifier has a gain of (N+1). In the self-oscillating circuit, a frequency selection circuit is provided which includes a positive feedback circuit connected between an output and a non-inverting input of an amplifier, and an electrostatic converter including a first terminal connected to the positive feedback circuit, and a second terminal connected to ground. The positive feedback circuit includes an electrostatic capacitance and a resistor selected such that a self-oscillation frequency of the self-oscillation circuit is determined by said frequency selection circuit.

6 Claims, 14 Drawing Sheets

FIG. IIA
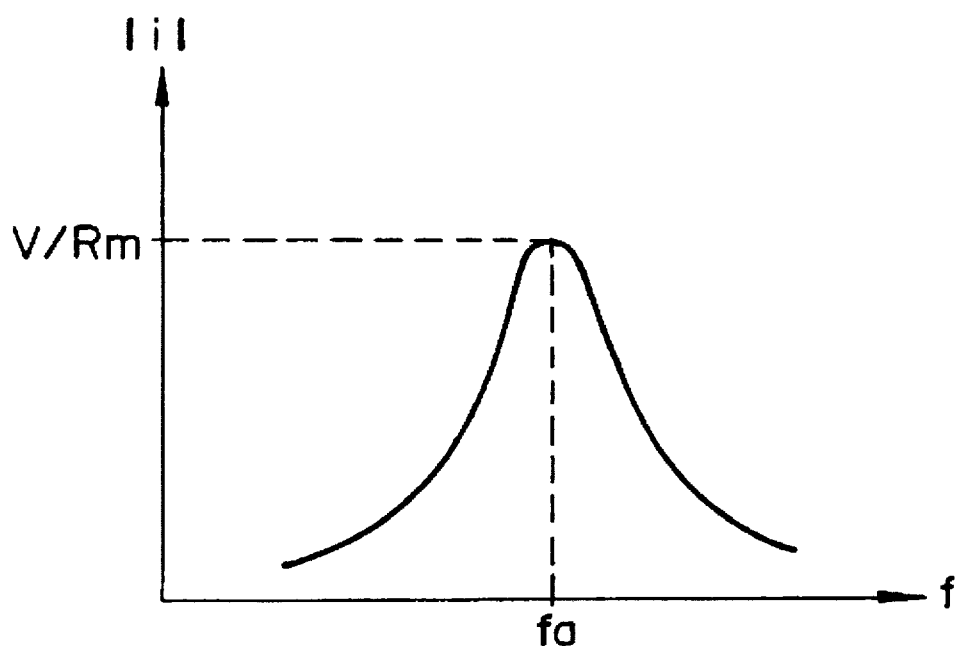
FIG. IIB
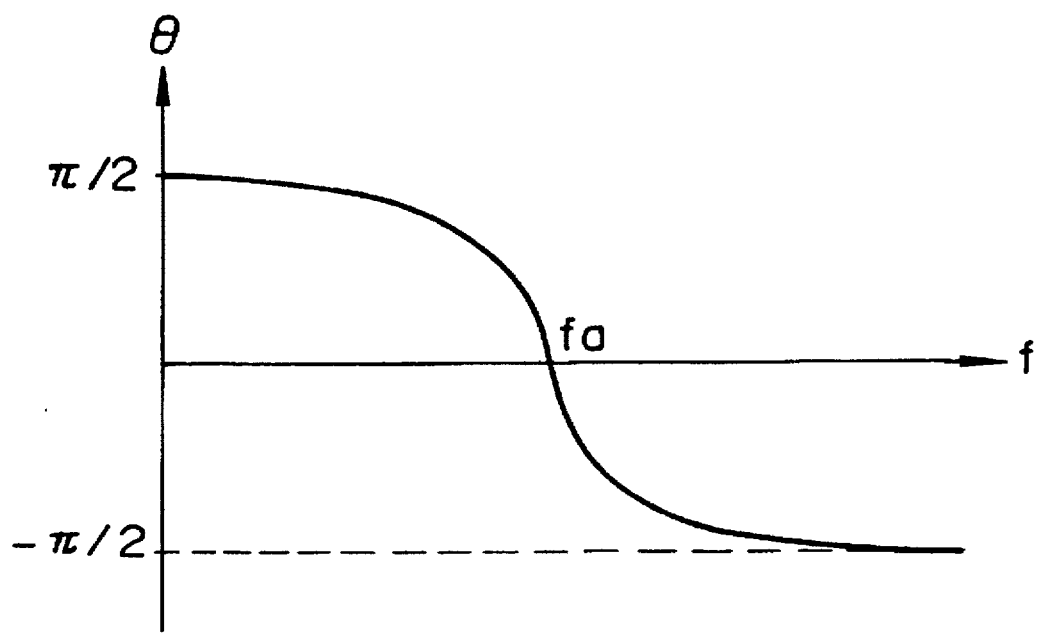

DRIVING APPARATUS FOR ELECTROSTATIC CONVERTING MEANS

BACKGROUND OF THE INVENTION

1. Field of the Invention

The present invention relates to a driving apparatus for driving electrostatic converting means such as a piezoelectric oscillator or an electrostatic converter having such structure that flat electrodes face each other with a gap, used for a piezoelectric transformer, a piezoelectric motor, and an oscillation type gyroscope, more particularly to a driving apparatus for a piezoelectric oscillator which can drive it saving electric power by reducing or canceling electric power consumption in driving, in a damping capacitance of the piezoelectric oscillator and a capacitance component of an electrostatic converter.

2. Description of the Related Art

FIG. 17A shows a piezoelectric oscillator 1 as an example of electrostatic converting means. FIG. 17B shows an equivalent circuit of the oscillator 1 when it performs an oscillation operation in the vicinity of a resonance point. The piezoelectric oscillator 1 can be expressed as the equivalent circuit shown in FIG. 17B in the case where it performs the oscillation operation at a frequency range of a narrow band in the vicinity of the resonance point.

A series resonance arm 3 composed of elements Rm, Cm, and Lm illustrates equivalently the resonance state of the piezoelectric oscillator 1. Reference symbol Cd indicates a damping capacitance component of the piezoelectric oscillator 1, which is included in a parallel resonance arm 4 comprising the series resonance arm 3. FIG. 18 shows an admittance characteristic of the piezoelectric oscillator 1. Referring to FIG. 18, reference symbol fa indicates a resonance frequency of the series resonance arm 3 (simply referred to as a resonance frequency), and reference symbol fb indicates a resonance frequency of the parallel resonance arm 4 (simply referred to as a resonance frequency).

When driving the piezoelectric oscillator 1, a current flowing across the damping capacitance Cd provides any contribution to the oscillation of the piezoelectric oscillator 1. Since the current is supplied to the damping capacitance Cd, an electric power consumed by the damping capacitance Cd must be supplied to the piezoelectric oscillator 1, in addition to that required for a driving power source to oscillate the piezoelectric oscillator 1, thereby making a driving power source capacitance large.

FIG. 19 shows a conventional circuit for canceling equivalently the current flowing across the damping capacitance Cd when the piezoelectric oscillator 1 is driven at the resonance frequency fa.

In the conventional circuit shown in FIG. 19, a coil with an inductance Ld is coupled in series to the piezoelectric oscillator 1.

An impedance Zm of the series resonance arm 3 is expressed by the formula (1), as follows.

$$Zm = Rm + j\omega Lm + \frac{1}{j\omega Cm} \quad (1)$$

The current I flowing into both of the piezoelectric oscillator 1 and inductance Ld is expressed by the formula (2), assuming that an alternating driving electric power source 5 be a constant voltage source, and a voltage applied to the piezoelectric oscillator 1, V.

$$I = \left(\frac{1}{Zm} + j\omega Cd + \frac{1}{j\omega Ld}\right) V \quad (2)$$

$$= \left\{\frac{1}{Zm} + j\left(\omega Cd - \frac{1}{\omega Ld}\right)\right\} V$$

To make the piezoelectric oscillator 1 perform an oscillation operation at the resonance point fa, it is necessary to connect a coil with an inductance Ld satisfying the formula (3) in parallel to the piezoelectric oscillator 1. Only under this condition, the current I satisfies the formula (4).

$$\omega Cd = \frac{1}{\omega Ld}$$

$$Ld = \frac{1}{\omega^2 Cd} = \frac{1}{(2\pi f)^2 Cd} \quad (3)$$

$$I = \frac{1}{Zm} \quad (4)$$

When the coil with the inductance Ld shown in the formula (3) is connected in parallel to the piezoelectric oscillator 1, the damping capacitance Cd of the oscillator 1 is canceled equivalently. To eliminate the current flowing through the damping capacitance Cd makes it possible to reduce the electric power capacitance of the driving power source.

However, in the circuit shown in FIG. 19, to cancel the brake capacitance of the piezoelectric oscillator 1, it is necessary to arrange the inductance Ld satisfying the condition required by the aforementioned formula (3). The inductance Ld for satisfying the condition of the formula (3) is inversely proportional to $f^2 \times Cd$, where f is a driving frequency, and Cd is the damping capacitance. Particularly, the inductance Ld is inversely proportional to the square of the driving frequency. For this reason, when the piezoelectric oscillator 1 is driven at a frequency shifting from the resonance frequency fa, as the difference between the driving frequency f and the resonance frequency fa is larger, a ratio where the damping capacitance Cd can be canceled by the inductance Ld reduces as illustrated by a secondary degree curve.

Furthermore, the coil for setting a value of the inductance Ld is larger in size, in general, compared to other electric parts such as the resistor R and the electrostatic capacitance (capacitor) C. As a result, when the coil is incorporated in the circuit, it is difficult to miniaturize the apparatus. In addition, to set the value of the inductance Ld so as to satisfy the formula (3) or approximately so as to satisfy it, it is required to adjust variably the value of the inductance Ld in accordance with the used piezoelectric oscillator 1. However, the inductance is not suited for the variable adjustment, compared to the resistor R and the electrostatic capacitance C.

Furthermore, an electrostatic convertor that is the same sort of electrostatic converting means as the piezoelectric oscillator has flat electrodes facing each other with a narrow gap. Applying a voltage across these electrodes, the electrostatic converter operates so as to change the gap, inversely, applying an external force so as to change the gap, the voltage across the electrodes changes. An equivalent circuit of this electrostatic converter is the same as that of the piezoelectric oscillator. Therefore, also in this electrostatic converter, its capacitance component consumes the driving electric power. The electrostatic converter has the same drawback as that of the piezoelectric oscillator that the electric power consumption becomes large.

SUMMARY OF THE INVENTION

The present invention is made to solve the above problems, an object of the present invention is to provide a circuit wherein an electric power for a brake capacitance of a piezoelectric oscillator or an electric power for a capacitance component of an electrostatic converter can be canceled or reduced without an inductance, and an electric power-saving effect can be achieved independent of a driving frequency.

Another object of the present invention is to achieve a miniaturization of the circuit by the electric power-saving for a driving power source and by employing no inductance that is generally an electric part of large size.

In a driving apparatus of the present invention for producing an oscillation by applying an alternating electric power to electrostatic converting means, wherein an electrostatic capacitance for canceling or reducing a capacitance component of the electrostatic converting means is connected either in parallel or in series to the electrostatic converting means.

The aforementioned electrostatic converting means is, for example, a piezoelectric oscillator serving as an electric distortion converter or an electrostatic converter having a structure that flat electrodes face each other with a small gap. The aforementioned capacitance component is a brake capacitance in case of the piezoelectric oscillator, and is a capacitance component between the facing electrodes in case of the electrostatic converter.

Furthermore, in a driving apparatus of the present invention for producing an oscillation by applying an alternating electric power to electrostatic converting means, an electrostatic capacitance coupled to an electrostatic converter and phase converting means for shifting the phase of a current flowing through the electrostatic capacitance by 180 degrees are provided, wherein either a current flowing through a capacitance component of the electrostatic converting means or a voltage applied to the capacitance component thereof is canceled by the electrostatic capacitance and the phase converting means, and either a current flowing through a capacitance component of the electrostatic converting means or a voltage applied to the capacitance component thereof is reduced by the electrostatic capacitance and the phase converting means.

When a piezoelectric oscillator as an example of the electrostatic converting means is driven at a constant voltage, for example, the electrostatic capacitance and the phase converting means are coupled in parallel to the piezoelectric oscillator. Furthermore, when the piezoelectric oscillator is driven at a constant current, the electrostatic capacitance and the phase converting means are connected in series to the piezoelectric oscillator.

Furthermore, in a driving apparatus of the present invention for producing an oscillation by applying a voltage to electrostatic converting means, the apparatus comprises an amplifier for amplifying a voltage applied to one terminal of the electrostatic converting means and an electrostatic capacitance coupled between an output terminal of the amplifier and the one terminal of the electrostatic converting means.

In the aforementioned driving circuit, when the electrostatic capacitance is 1/N times the capacitance component of the electrostatic converting means, an amplification factor of the amplifier should be approximately (N+1).

Furthermore, a driving apparatus of the present invention for producing an oscillation by applying a voltage to electrostatic converting means comprises a frequency selection circuit including a capacitance component and resistor component of an electrostatic converting means and an amplifier with this frequency selection circuit arranged in its positive feedback loop, wherein the apparatus performs a self-oscillation at a frequency determined by the aforementioned frequency selection circuit.

In the aforementioned frequency selection circuit, a resistor and an electrostatic capacitance are coupled each other in the amplifier, and one terminal of the electrostatic converting means is coupled to a non-inverting input of the amplifier.

In the driving apparatus of the present invention, an electrostatic capacitance is coupled to electrostatic converting means such as a piezoelectric oscillator, and a capacitance component such as a damping capacitance Cd of the piezoelectric oscillator, for example, is canceled or reduces by a voltage applied to the electrostatic capacitance or a current flowing therethrough. Since an electric power consumption at the capacitance component of the damping capacitance Cd and so on can be canceled or reduced at the time of the oscillation of electrostatic converting means, an electric power-saving of driving can be produced.

Furthermore, since a coil is not employed in the apparatus, a reducing effect concerning the capacitance component does not fall greatly as in the conventional apparatus shown in FIG. 19, though the difference between a driving frequency and resonance frequency of the electrostatic converting means may be produced. Therefore, the effect of canceling and reducing of the capacitance component can be exhibited at any driving frequency.

Furthermore, the circuit can be miniaturized as a result of employing no coil. In addition, by making the capacitance value of the electrostatic capacitance variable, canceling of the capacitance component or reducing it can be set appropriately in accordance with the employed piezoelectric oscillator, thereby facilitating the adjustment of the capacitance component.

In the aforementioned means, the electrostatic capacitance made approximately equal to the capacitance component of the electrostatic converting means is employed, the phase of a current flowing through the electrostatic capacitance is preferably shifted by 180 degrees by phase converting means. Thus, it becomes possible to cancel or reduce the electric power applied to the capacitance component such as the brake capacitance.

Furthermore, in the apparatus of the present invention, wherein a voltage is applied to the electrostatic type converting means, there are provided with an amplifier for amplifying a voltage at electrostatic converting means and an electrostatic capacitance coupled in series to the amplifier and further coupled to the electrostatic converting means. In this apparatus, the current flowing through the electrostatic capacitance based on the amplified voltage by the amplifier serves to reduce a current flowing through a brake capacitance of a piezoelectric oscillator.

Particularly, by setting the capacitance value of the electrostatic capacitance approximately 1/N times the capacitance component of the damping capacitance and the like of the piezoelectric oscillator, and the voltage amplification factor of the aforementioned amplifier (N+1) times the capacitance component of the brake capacitance, it becomes possible to cancel the electric power applied to the brake capacitance and the like.

The driving apparatus of the electrostatic converting means of the present invention is provided with an amplifier constituted of an operational amplifier, and a frequency selection circuit disposed in a positive feedback loop (a positive feedback path of the amplifier). The frequency selection circuit includes a capacitance component and resistor component of the electrostatic converting means, and in more detail, the capacitance component and resistor component of the electrostatic converting means are in a resonance state (a series resonance state), so that the driving apparatus can be constituted so as to perform a self-oscillation in the vicinity of the resonance point of the electrostatic converting means.

The driving apparatus of the present invention utilizes the principle of the Wien bridge oscillation circuit. The frequency selection circuit in this oscillation circuit can be constituted of a first capacitance and first resistor, for example, coupled in series with each other, included in a positive feedback loop of an amplifier, and a second capacitance and second resistor, in parallel with each other, coupled to a non-inverting input terminal of the amplifier. It is noted that by replacing the second capacitance and second resistor with electrostatic converting means driven in the vicinity of the resonance point, a self-oscillation circuit can be constituted, which is oscillated at a frequency determined by factors composed of a capacitance component and resistor component of the electrostatic converting means.

In the aforementioned frequency selection circuit, the first and second capacitances serve as low-pass and high-pass filters, respectively, and a band-pass filter between the input and output terminals of the amplifier is constituted so that the frequency of the self-oscillation is determined. It is noted that there maybe the occasion that the difference between the resonance frequency of two frequencies is produced, one is a resonance frequency of the electrostatic converting means such as the piezoelectric oscillator; the other, a frequency of the self-oscillation determined by the aforementioned frequency selection circuit. Therefore, as shown in FIG. 14, when an additional capacitance C' and an additional resistor R' are coupled, in parallel or in series, to the electrostatic converting means and cutoff frequencies of the aforementioned low-pass and high-pass filters are adjusted with the additional capacitance and the additional resistor, the self-oscillation operation can be performed at the resonance frequency of the electrostatic converting means.

Furthermore, by arranging a resistor for setting an amplification factor in a negative feedback loop of the amplifier, it becomes possible to stabilize an amplitude of the self-oscillation.

BRIEF DESCRIPTION OF THE DRAWINGS

Other objects and features of the present invention will become apparent from the following description of the preferred embodiments of the present invention considered in conjunction with the accompanying drawings in which:

FIG. 11A is a diagram showing a frequency-current characteristic in the embodiment shown in FIG. 10;

FIG. 11B is a diagram showing a frequency-phase characteristic in the embodiment shown in FIG. 10;

DESCRIPTION OF THE PREFERRED EMBODIMENTS

For the electrostatic converting means of the present invention, there are a piezoelectric oscillator and an electrostatic converter wherein flat electrodes face each other. The description of the embodiment using a piezoelectric oscillator as an example is provided below.

Figure 1:
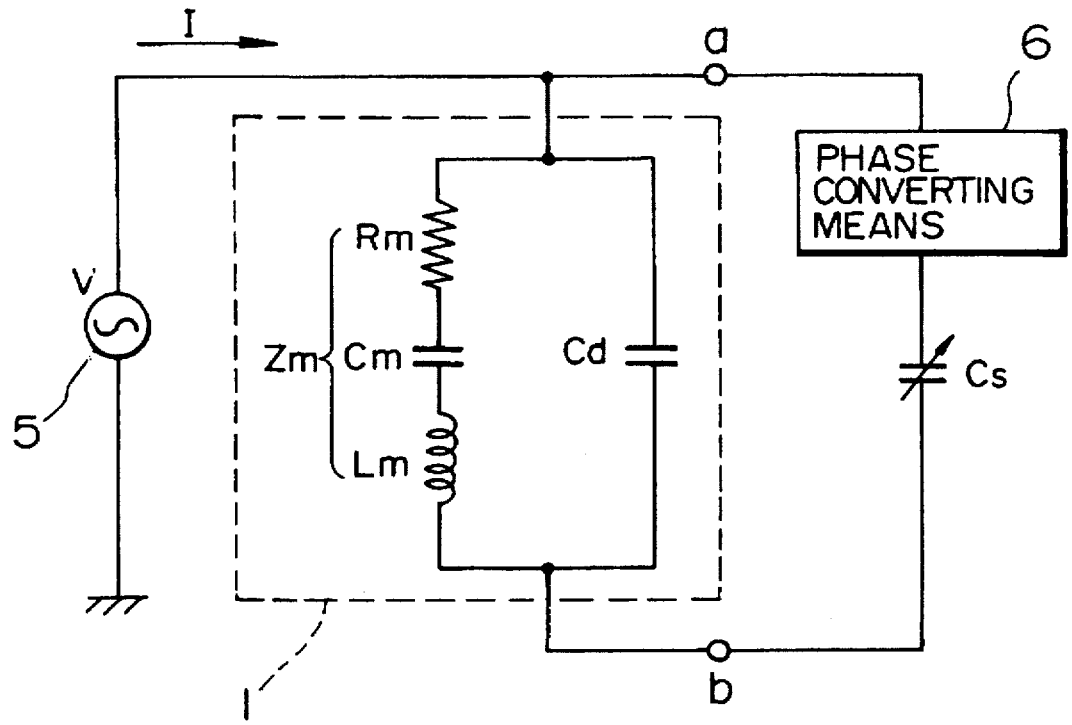
FIG. 1 is an equivalent circuit for explaining the first aspect of the present invention, at the time when a piezoelectric oscillator is driven at a constant voltage.

FIG. 1 is a circuit diagram showing a first aspect of the present invention. This circuit diagram is illustrated as a circuit including an equivalent circuit in which a piezoelectric oscillator 1 performs a resonance oscillation in the vicinity of a resonance point.

Referring to FIG. 1, an electrostatic capacitance Cs serving as a capacitance added to the piezoelectric oscillator 1 and phase converting means 6 are coupled in series with each other. This series circuit is coupled in parallel to the piezoelectric oscillator 1. The phase converting means 6 serves to shift the phase of a current flowing through the electrostatic capacitance Cs by 180 degrees.

When the phase of the current flowing through the electrostatic capacitance Cs is shifted by 180 degree by the phase converting means 6, the admittance of the series circuit composed of the electrostatic capacitance Cs and the phase converting means 6 is expressed as $(-j\omega Cs)$. Therefore, supposing that a voltage applied to the piezoelectric oscillator 1 from an alternating driving power source 5 is V, the current I flowing through the piezoelectric oscillator 1 and the electrostatic capacitance Cs will be expressed by the formula (5).

$$I = \left(\frac{1}{Zm} + j\omega Cd - j\omega Cs\right)V$$

$$= \frac{1}{Zm} \cdot V(Cd - Cs)$$

(5)

Figure 19:
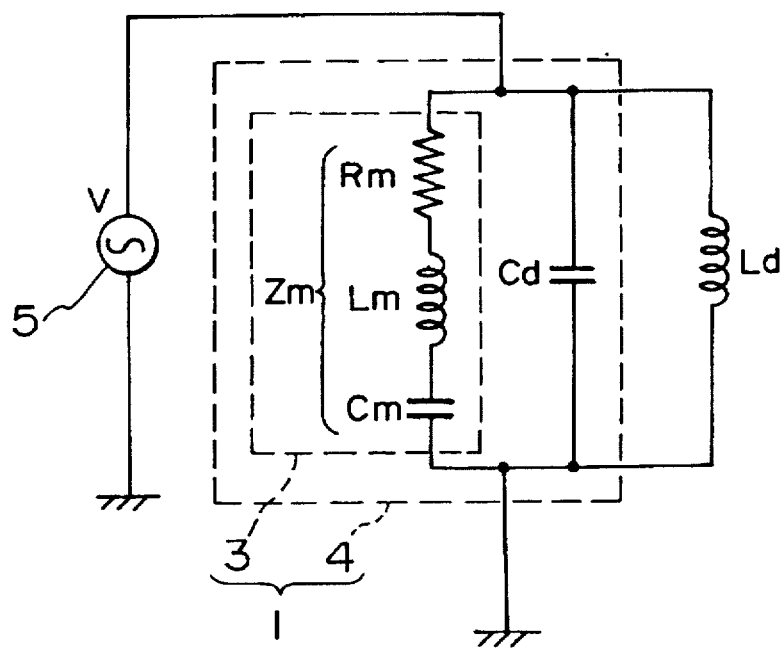
FIG. 19 is a circuit diagram of a conventional driving apparatus for canceling a brake capacitance.

As shown in the formula (5), supposing the electrostatic capacitance Cs be approximately equal to a brake capacitance Cd, I=1/Zm is established. Taking the alternating driving power source 5 as a reference power source, the current concerning the brake capacitance Cd can be canceled equivalently. In this case, the condition for canceling the current concerning the brake capacitance Cd is Cs=Cd, this is not a function of the driving frequency f:f=ω/2π as in the canceling condition expressed by the formula (3), the formula (3) being satisfied in the circuit using the inductance Ld shown in FIG. 19. Specifically, when Cs=Cd is satisfied, the condition for canceling the current flowing through the damping capacitance Cd does not depend on the frequency, the damping capacitance Cd can be canceled equivalently all over the frequency range. The adjustment of the capacitance value of the electrostatic capacitance Cs is much easier compared to the case where the inductance is employed. The miniaturization of the circuit can be achieved, since the employed parts are small. It is a matter of course that the advantage of reducing the influence of the damping capacitance Cd will be brought about expectedly, when the electrostatic capacitance Cs coupled additionally to the piezoelectric oscillator 1 is not completely equal to the damping capacitance Cd.

Figure 2:
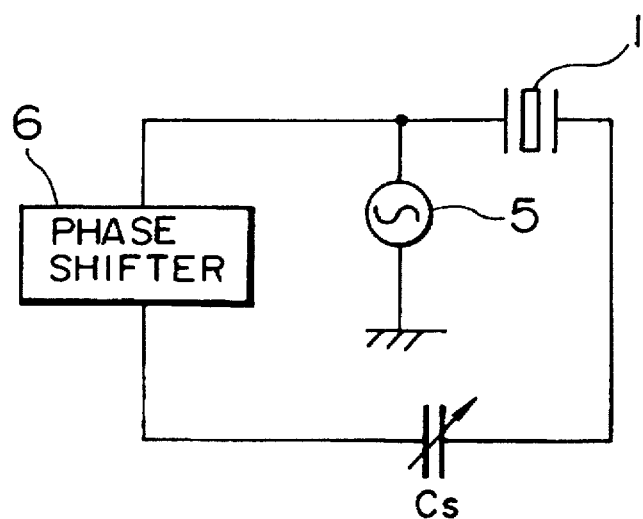
FIG. 2 is a circuit diagram showing an embodiment of the first aspect of the present invention shown in FIG. 1.

The first aspect of the present invention shown by the block diagram of FIG. 1 will be realized by the circuit shown in FIG. 2.

In the embodiment shown in FIG. 2, the electrostatic capacitance Cs and the phase converting means (phase shifter 6) are coupled in parallel to the piezoelectric oscillator 1. In this circuit, by coupling the electrostatic capacitance Cs approximately equal to the damping capacitance Cd of the piezoelectric oscillator 1 thereto, the electric power applied to the damping capacitance Cd from the alternating driving power source 5 can be reduced as expressed by the formula (5).

Figure 3:
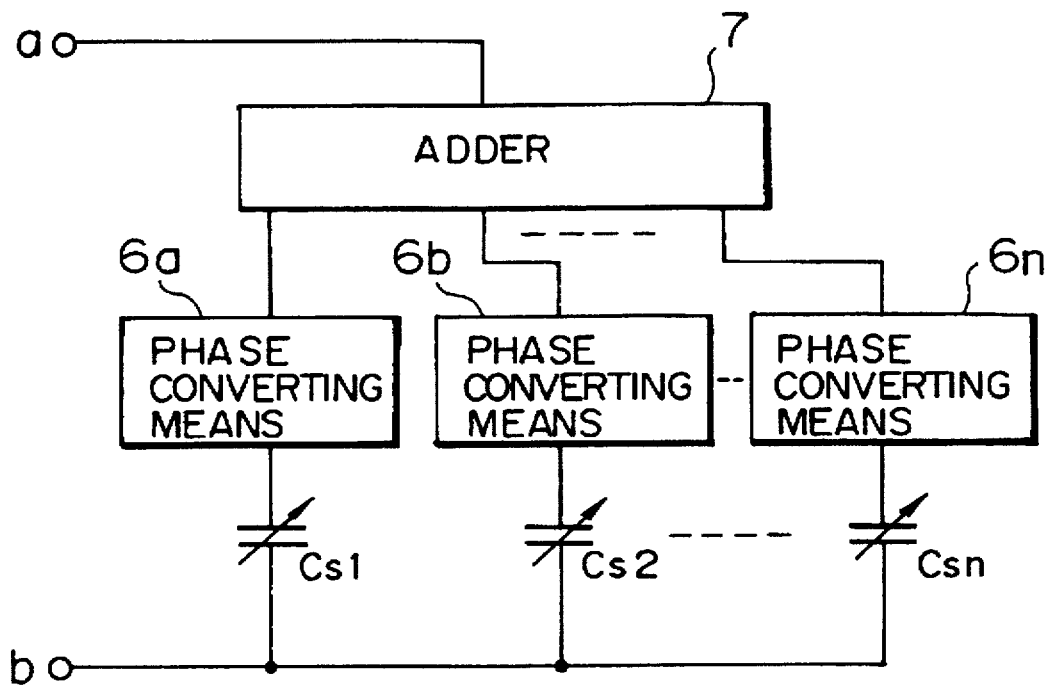
FIG. 3 is a circuit diagram showing a modified example of the first aspect of the present invention.

Furthermore, the aforementioned first aspect of the present invention can be also constituted by arranging a plurality of electrostatic capacitances Cs1, Cs2, and Cs3 between the points a and b on the circuit of FIG. 1, as shown in FIG. 3. In this case, a plurality of phase converting means 6a, 6b, ..., and 6n are coupled in series to the corresponding electrostatic capacitances Cs1, Cs2, ..., and Csn, respectively, and an adder 7 is provided for adding the currents flowing through all of the phase converting means and capacitances. At this time, as shown by the formula (6), the total sum of the electrostatic capacitances Cs1, Cs2, ..., and Csn is equivalent to one capacitance Cs shown in FIG. 1.

$$Cs = \sum_{i=1}^{n} Csi$$

(6)

Figure 4:
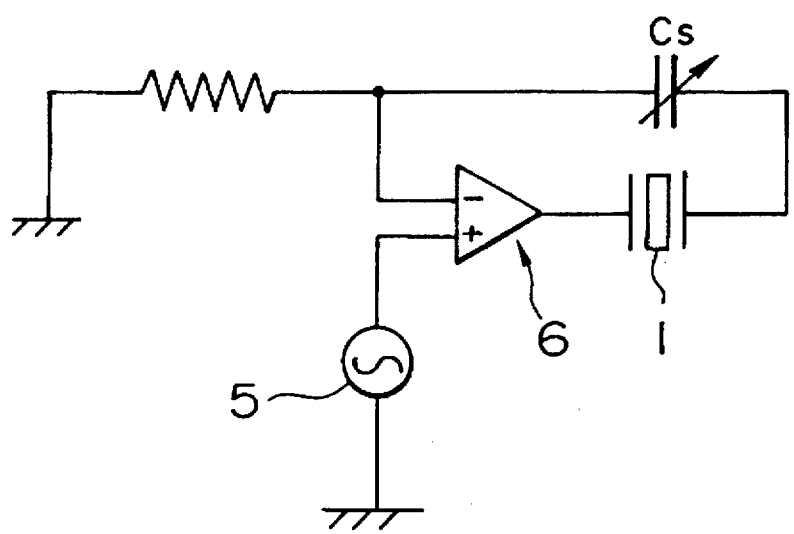
FIG. 4 is a circuit diagram showing another embodiment of the first aspect of the present invention.
Figure 5:
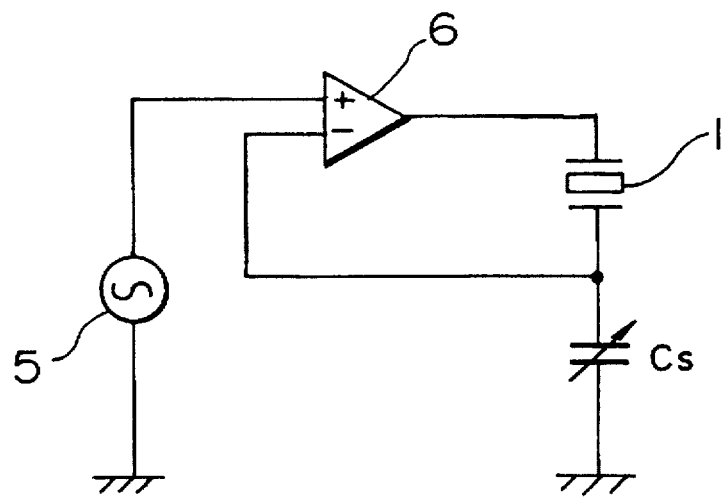
FIG. 5 is a circuit diagram showing still another embodiment of the first aspect of the present invention.

Furthermore, FIGS. 4 and 5 show examples of the driving apparatus of the first aspect of the present invention employing operational amplifiers as the phase converting means 6. Both of them employ the operational amplifiers as an inverting amplifier. In the driving apparatus of FIGS. 4 and 5, the phase of the current flowing through the electrostatic capacitance Cs is shifted by 180 degrees. Also in the driving apparatus of FIGS. 4 and 5, the current flowing through the brake capacitance Cd can be canceled or reduced in the same manner as in the circuit of FIG. 1.

Figure 6:
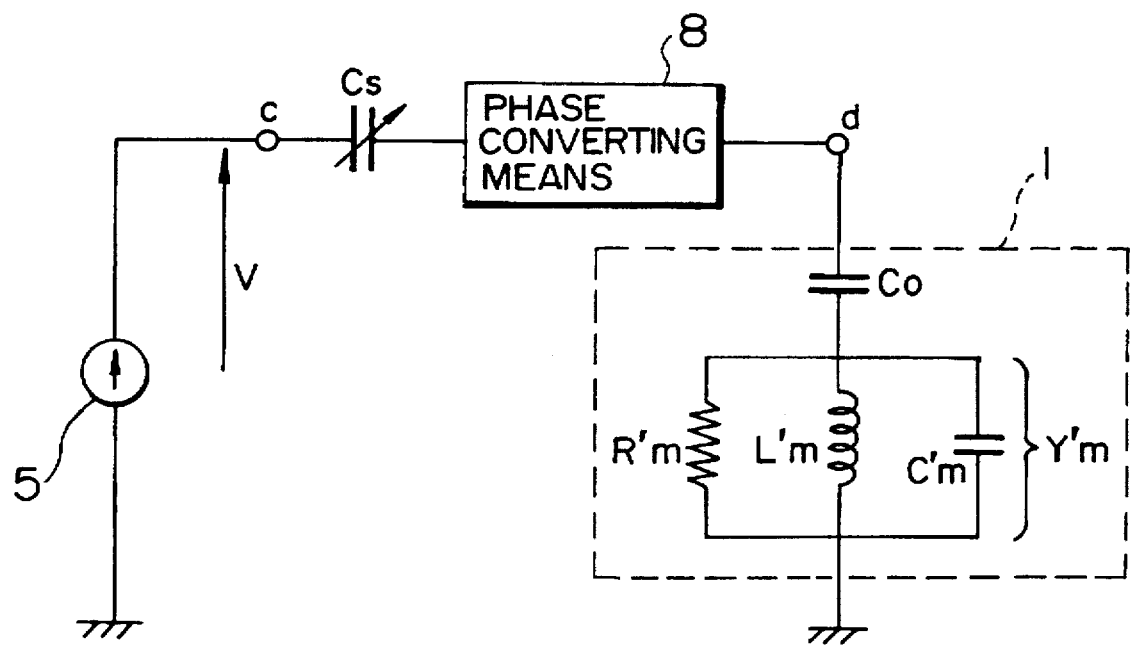
FIG. 6 is an equivalent circuit for explaining the second aspect of the present invention, at the time when the piezoelectric oscillator is driven at a constant current.

FIG. 6 is a circuit diagram of the driving apparatus of the second aspect of the present invention.

Figure 18:
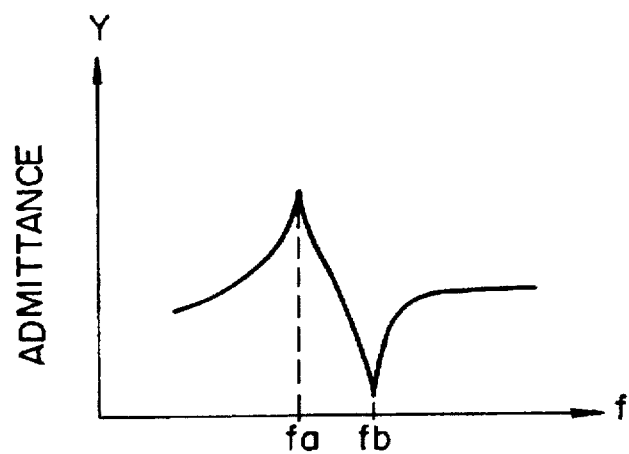
FIG. 18 is a diagram showing a characteristic of a frequency and an admittance at the time when the piezoelectric oscillator oscillates.

FIG. 6 shows an equivalent circuit wherein an alternating driving power source 5 is a constant current source, and a piezoelectric oscillator 1 is driven to perform the oscillation operation in the vicinity of an anti-resonance frequency fb (see FIG. 18).

An electrostatic capacitance Cs and phase converting means 8 are coupled in series to the piezoelectric oscillator 1. The phase converting means 8 serves to shift the phase of the current flowing through the electrostatic capacitance Cs by 180 degrees.

As a result that the phase of the current flowing through the electrostatic capacitance Cs is shifted by 180 degrees by the phase converting means 8, an impedance between the points c and d becomes −(1/j ωCs), the electrostatic capacitance Cs and the phase converting means 8 being present between the points c and d. Therefore, assuming the potential at the point c to be V, the relation between the current I given from the alternating driving power source 5 as the constant current source and the voltage is expressed by the following formula (7).

$$V = \left(\frac{1}{Ym} + \frac{1}{j\omega C_0} - \frac{1}{j\omega C_s}\right)I$$

$$= \frac{1}{Ym} \cdot I(C_0 - C_s)$$

(7)

As expressed in the formula (7), assuming that the electrostatic capacitance Cs is equivalent to the damping capacitance Co, V=(1/Y'm) is satisfied, and the voltage applied to the damping capacitance Co is canceled equivalently on the circuit, thereby leading to no electric power consumption by the damping capacitance Co. Note that it is proved from the formula (7) that the voltage consumed by the damping capacitance Co can be reduced by an amount in accordance with the value of the electrostatic capacitance Cs, though the electrostatic capacitance Cs is not equivalent precisely to the damping capacitance Cd.

In addition, as seen from the formula (7), the required condition for canceling or reducing the voltage applied to the damping capacitance Co is that the values of them are equal to each other, and it does not depend on the frequency. Therefore, the piezoelectric oscillator 1 is not necessarily being driven at the anti-resonance frequency fb, the voltage applied to the damping capacitance Co can be reduced effectively by the electrostatic capacitance Cs, as in the first aspect of the present invention, even when the driving frequency is different from the anti-resonance frequency.

Figure 7:
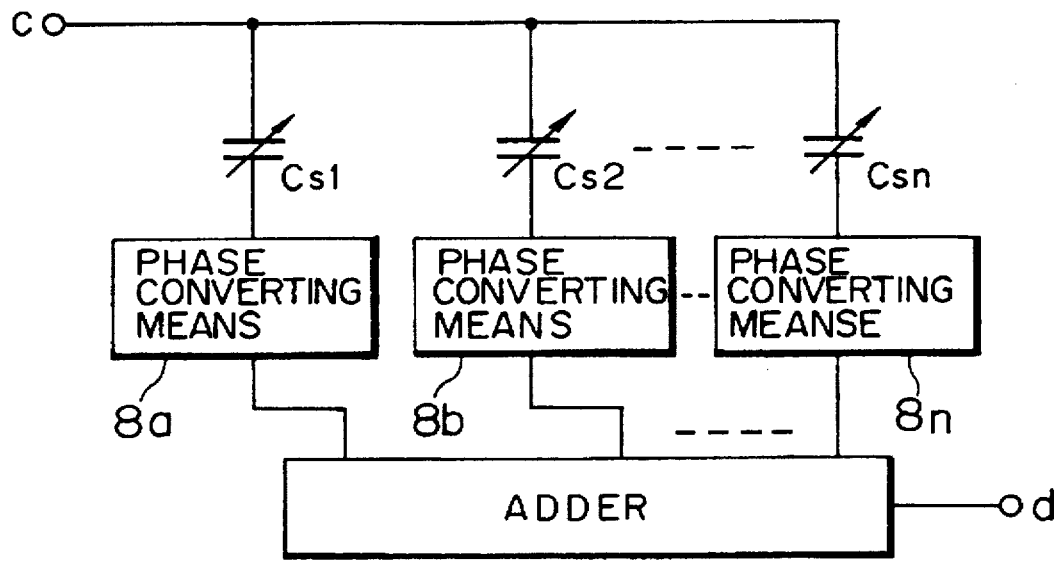
FIG. 7 is a circuit diagram showing a modified example of the second aspect of the present invention shown in FIG. 6.

Furthermore, as shown in FIG. 7, a plurality of electrostatic capacitances Cs1, Cs2, ..., Csn are coupled in series between the points c and d, and a plurality of phase converting means 8a, 8b, ..., and 8n for shifting the phases of the currents flowing through the respective capacitances by 180 degrees are coupled in series to the corresponding electrostatic capacitances. An adder 9 for adding the currents flowing through each of the electrostatic capacitances Cs1, Cs2, ..., Csn is arranged between the phase converting means 8a, 8b, ..., 8n and the point d. This circuit shown in FIG. 7 may be disposed between the point c and d of FIG. 6.

The relation of each of the electrostatic capacitances Cs1, Cs2, ..., Csn shown in FIG. 7 and the electrostatic capacitance Cs shown in FIG. 6 is the same as that expressed in the formula (6).

Figure 8:
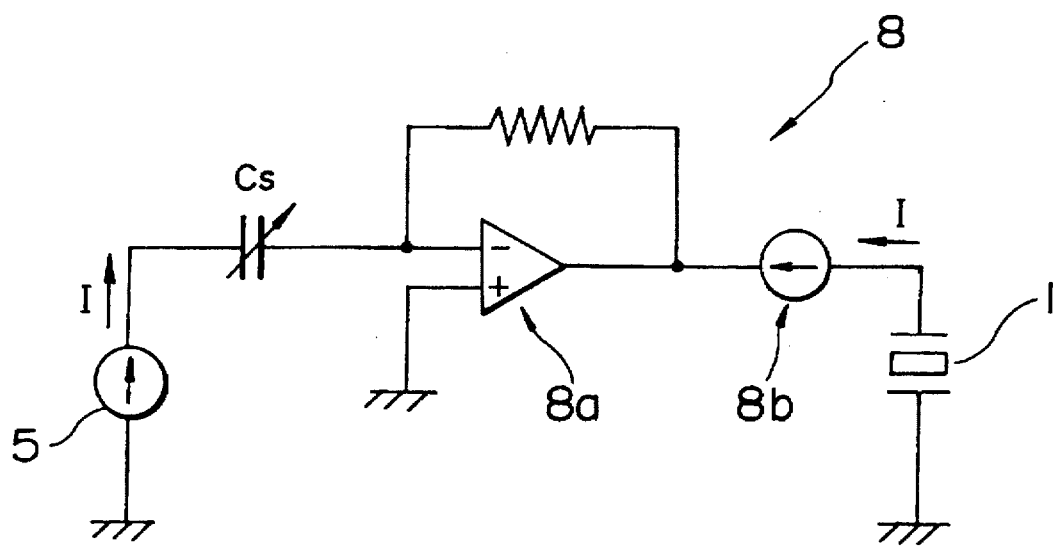
FIG. 8 is a circuit diagram showing an embodiment of the second aspect of the present invention.
Figure 9:
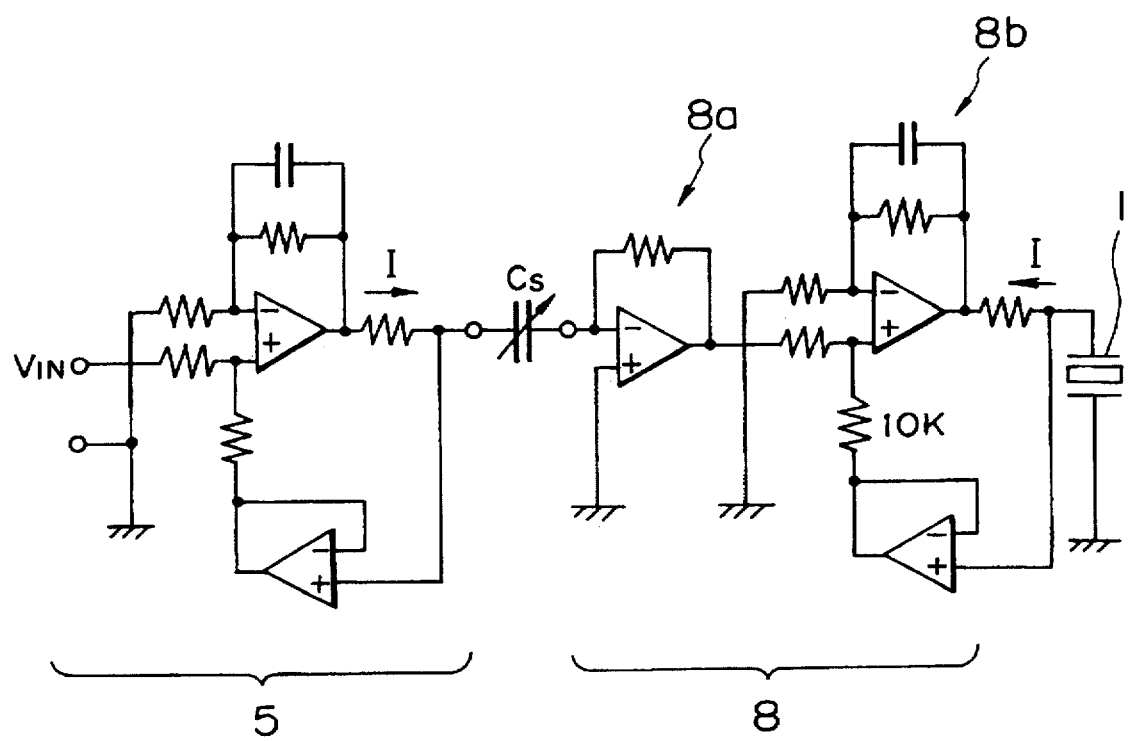
FIG. 9 is a circuit diagram showing the circuit of FIG. 8, in more detail.

The driving apparatus of the second aspect of the present invention shown in the block diagram of FIG. 6 is embodied by employing the circuits of FIGS. 8 and 9. The circuit shown in FIG. 9 illustrates a more detailed embodiment of the circuit of FIG. 8.

In the circuit shown in FIG. 8, the alternating driving power source 5 is a constant current source. In FIG. 9, only a constant current circuit is exemplified, selectively, of the alternating driving power source serving as the constant current source. The current provided from the constant current source is converted to the voltage by a current-voltage converting circuit 8a, specifically, the circuit 8a serves to shift the phase of the current by 180 degrees, as the phase converting means. The voltage obtained by converting the current by the current voltage converting circuit 8a is made a constant current by a constant current circuit 8b and is supplied to a piezoelectric oscillator 1.

The operation of the circuits shown in FIGS. 8 and 9 are performed in the same manner as that explained with FIG. 6. As is expressed by the formula (7), the voltage applied to the damping capacitance Co can be canceled or reduced in the circuit by the electrostatic capacitance Cs. Since a coil is not employed, the driving apparatus can be miniaturized. In canceling or reducing, by the electrostatic capacitance Cs, the voltage applied to the damping capacitance Co, since canceling or reducing can be performed independent of the frequency, the canceling or reducing effect for the voltage applied to the damping capacitance Co can be exhibited even when the frequency of the driving electric power supplied from the alternating driving power source 5 is shifted from the anti-resonance frequency Fb.

Figure 10:
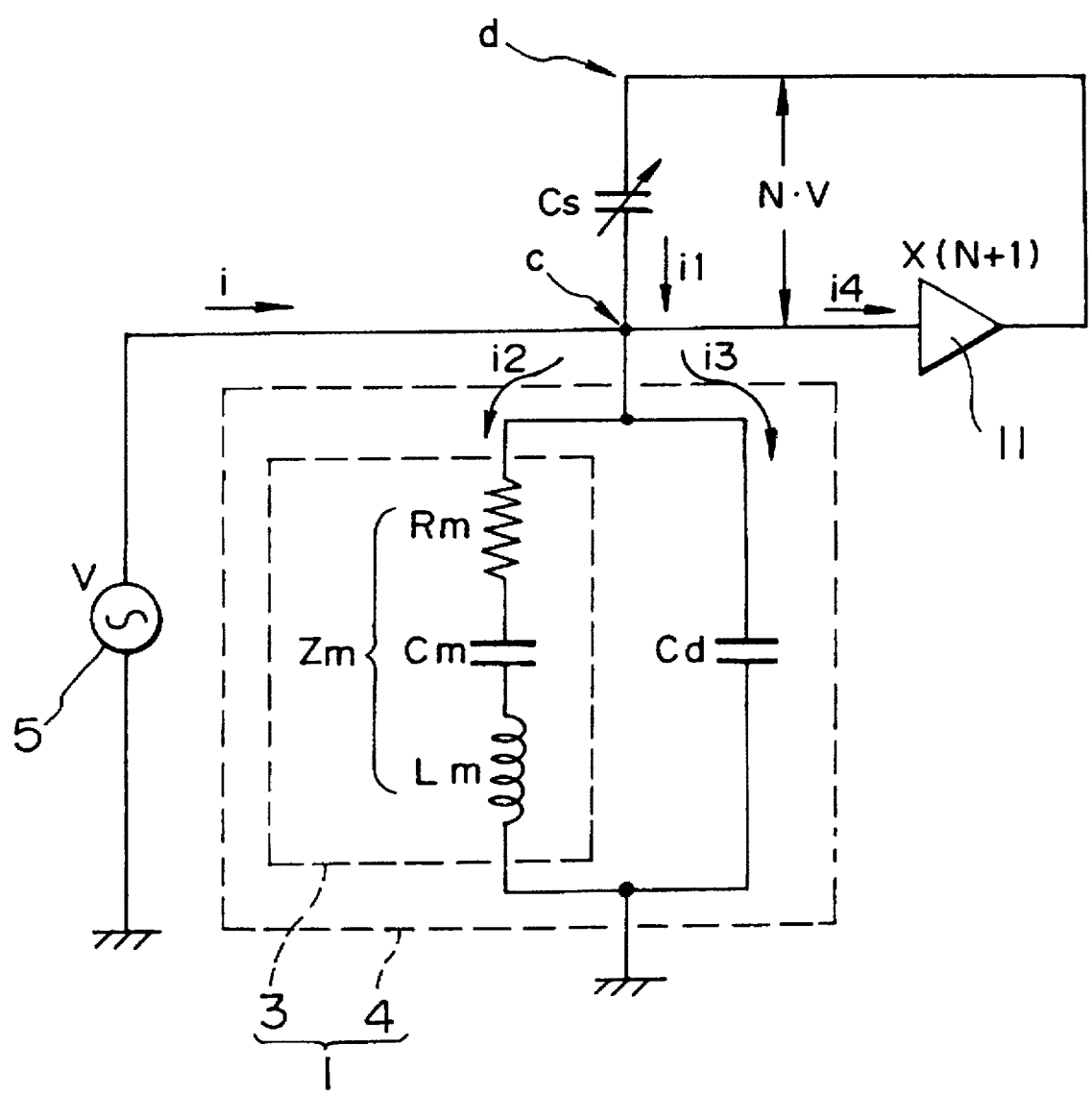
FIG. 10 is a circuit diagram showing an example of the third aspect of the present invention.

FIG. 10 is a circuit diagram showing a driving apparatus of the third aspect of the present invention. In FIG. 10, an equivalent circuit is shown when a piezoelectric oscillator 1 performs a resonance operation in a vicinity of a resonance frequency fa.

In the circuit of FIG. 10, one electrode of the piezoelectric oscillator 1 is coupled to a ground, or it may be set at a predetermined potential. An alternating driving power source 5 has one terminal coupled to the ground and the other terminal coupled to the other electrode of the piezoelectric oscillator 1.

Furthermore, the other electrode of the piezoelectric oscillator 1, i.e. the point c supplied with a voltage V from the alternating power source 5, is coupled to a loop circuit (feedback circuit) constituted by an electrostatic capacitance Cs and an amplifier 11 coupled in series each other. This amplifier serves to amplify the voltage applied to the electrostatic capacitance Cs. One electrode of the electrostatic capacitance Cs is coupled to the output terminal of the amplifier 11 and the other electrode thereof is coupled to the other electrode of the piezoelectric oscillator 1, i.e. the point c that is the electric power supplying terminal of the piezoelectric oscillator 1.

When the electrostatic capacitance Cs is 1/N times the damping capacitance Cd of the piezoelectric oscillator 1, the voltage amplification factor of the aforementioned amplifier 11 should be approximately (N+1). At this time, as shown in FIG. 10, the voltage, i.e. the voltage between the points c and d, applied to the electrostatic capacitance Cs becomes N·V.

As is shown in FIG. 10, in the circuit where one electrode of the piezoelectric oscillator 1 is grounded, it is assumed that the current flowing into the point c from the alternating driving power source 5 is i, and the current flowing into the point c from the electrostatic capacitance Cs is i1. Furthermore, it is also assumed that the impedance of a series resonance arm 3 of the piezoelectric oscillator 1 is Zm, and the current flowing through the brake capacitance Cd is i3. It should be noted that since the current i4 flowing into the amplifier 11 from the point c is small, it may be neglected. Each of the currents i1, i2, i3, and 1 are expressed by the formulas (8), (9), (10), and (11), respectively.

$$i1 = j\omega Cs \cdot N \cdot V \quad (8)$$

$$i2 = \frac{V}{Zm} \quad (9)$$

$$i3 = j\omega Cd \cdot V \quad (10)$$

$$i = i2 + i3 - i1 \quad (11)$$

Solving the formulas (6), (7), (8), and (9) to obtain i, the formula (12) is obtained.

$$i = \frac{V}{Zm} + j\omega(Cd - N \cdot Cs) \quad (12)$$

$$Cs = \frac{Cd}{N} \quad (13)$$

When the condition expressed by the formula (13) is satisfied, i is expressed by the following formula (14), and it becomes equal to i2.

$$i = \frac{V}{Zm} = \frac{V}{Rm + j\left(\omega Lm - \frac{1}{\omega Cm}\right)} \quad (14)$$

$$= \frac{V \cdot e^{-j\theta}}{\sqrt{Rm^2 + \left(\omega Lm - \frac{1}{\omega Cm}\right)^2}}$$

Specifically, the output current i from the alternating driving power source 5 flows only into the impedance Zm of the series resonance arm 3 of the piezoelectric oscillator 1, and it does not flow into the damping capacitance Cd which does not concern the oscillating performance. In other word, the driving current from the alternating driving power source 5 is not consumed by the damping capacitance Cd.

Obtaining the phase θ of the current i flowing through the piezoelectric oscillator 1, the phase θ is expressed by the following formula (15)

$$\theta = \tan^{-1} \frac{\left(\omega Lm - \frac{1}{\omega m}\right)}{Rm} \quad (15)$$

The relation between the oscillation frequency and the current i and the relation between the oscillation frequency and the phase θ, at the time when the formulas (14) and (15) are satisfied, are shown in FIGS. 11A and 11B, respectively.

In the third aspect of the present invention, similar to the first aspect of the present invention, the condition for canceling the driving current flowing through the damping capacitance Cd is the formula (13), and this means that the condition is given as the functions of the electrostatic capacitance Cs and the amplification factor N of the amplifier 11, and it is not the function of the driving frequency f. Specifically, the condition for canceling the current flowing through the damping capacitance Cd does not depend on the oscillation frequency.

The adjustment of the electrostatic capacitance Cs for canceling the damping capacitance Cd can be executed by using a variable capacitance or a trimmer type variable electrostatic capacitance, and it can be executed far more easily than the conventional adjustment of the inductance Ld. In addition, miniaturization of the circuit can be realized. Furthermore, when the electrostatic capacitance Cs is made constant, and either the amplification factor N of the amplifier 11 or (N+1) thereof is made variable using a variable resistor, the same effects can be obtained and further miniaturization of the circuit can be achieved. The amplification factor of the amplifier 11 should be preferably (N+1) at the time when the electrostatic capacitance Cs is (1/N) times the damping capacitance Cd of the piezoelectric oscillator 1. However, this condition is not required to be satisfied precisely. If this condition is not satisfied precisely, the reduction of the current flowing through the damping capacitance Cd of the piezoelectric oscillator 1 can be achieved, so that the effect of power-saving driving can be exhibited.

Furthermore, the object of the circuit of FIG. 10 is to cancel or reduce the current i3 flowing through the damping capacitance Cd by the current i1 flowing through the electrostatic capacitance Cs. Therefore, in the case where the amplifier 11 is not arranged, for example, by applying the voltage equal to (N+1) V or close to this to the point c, the same effect can be exhibited. Specifically, by providing the loop circuit having the electrostatic capacitance Cs and the voltage supplying means for supplying the loop current to the electrostatic capacitance Cs, the same effect obtained in FIG. 10 can be expected.

Figure 12:
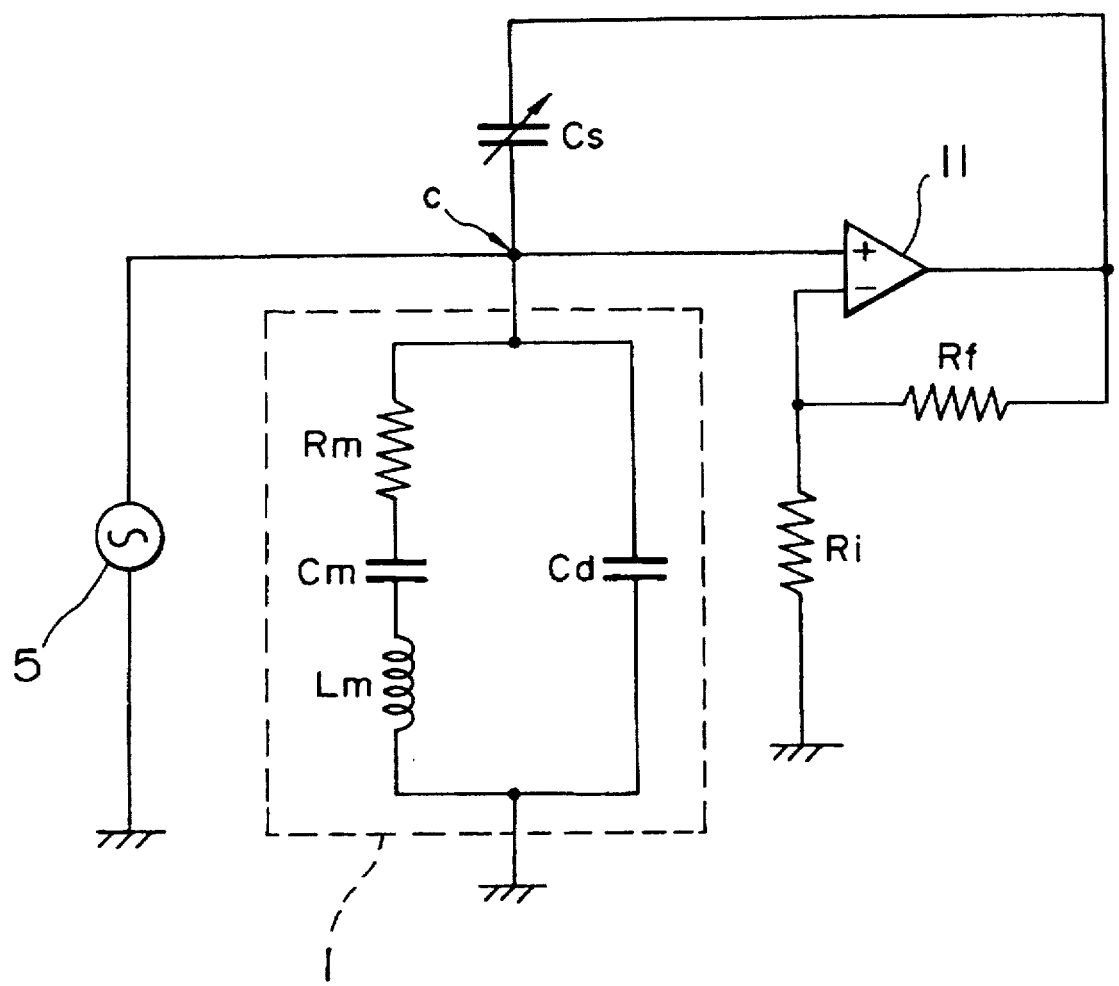
FIG. 12 is a diagram showing an embodiment of the third aspect of the present invention.

The third aspect of the present invention shown in FIG. 10 will be realized by employing the circuit shown in FIG. 12.

In FIG. 12, one electrode of a piezoelectric oscillator 1 is coupled to a ground, and the other electrode is coupled to an alternating driving power source 5. The point c is coupled to a loop circuit composed of an electrostatic capacitance Cs and an amplifier (operational amplifier) 11 connected to each other, however, a voltage amplification factor of the amplifier (operational amplifier) 11 is determined by resistors Ri and Rf.

When the electrostatic capacitance Cs is 1/N times a damping capacitance Cd, the current flowing through the damping capacitance Cd can be canceled as described above, by setting the voltage amplification factor (gain) as expressed by the formula (16).

$$\text{Gain} = (N+1) = 1 + \left(\frac{Rf}{Ri}\right) \tag{16}$$

In the above formula (16), if the resistor Rf is a variable resistor, by varying the resistance value of the resistor Rf and fixing the value of the electrostatic capacitance Cs, the same effect can be easily obtained.

Figure 13:
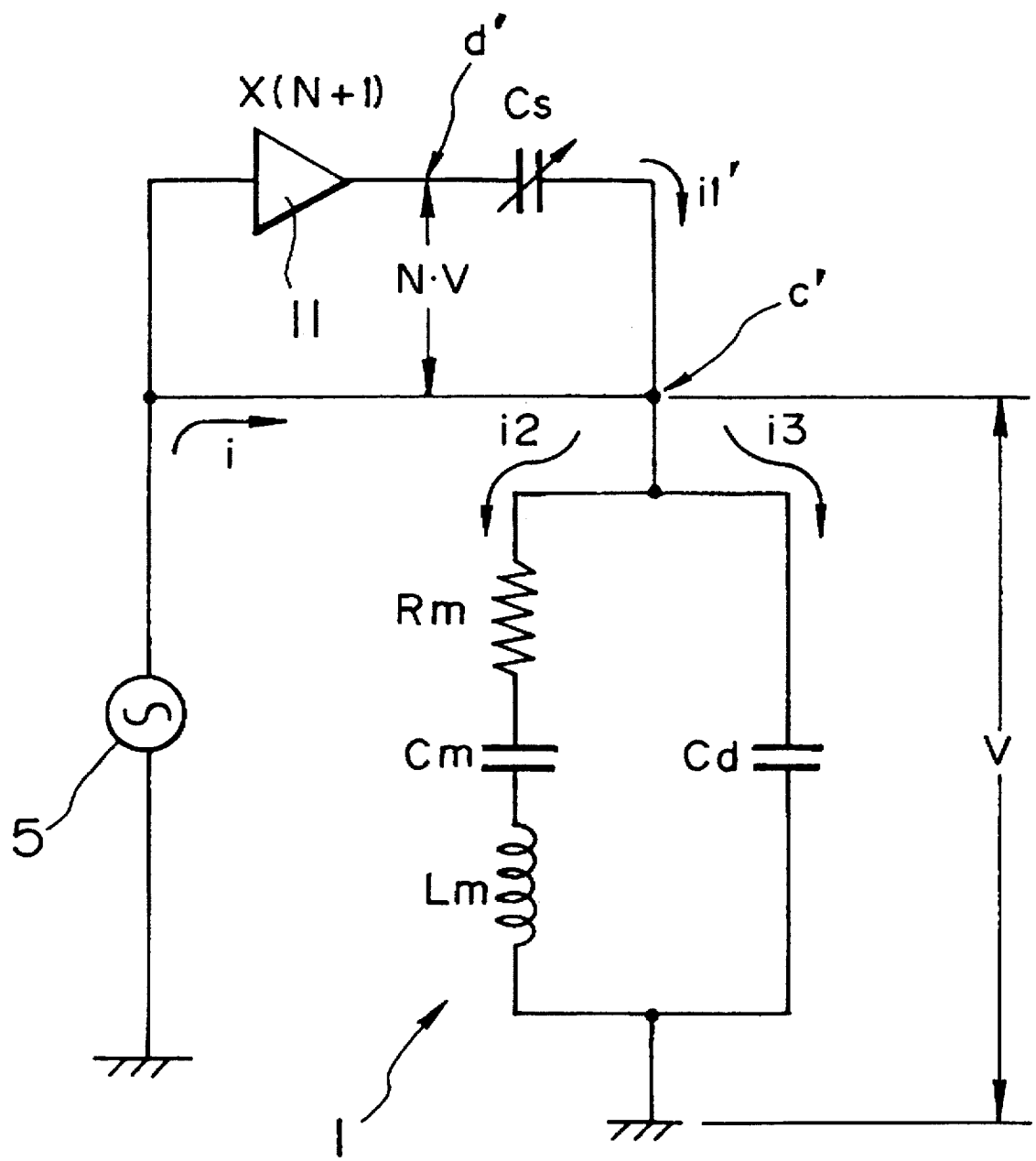
FIG. 13 is an equivalent circuit showing another constitution example of the third aspect of the present invention.

Furthermore, the third aspect of the present invention is not limited to the constitution of FIG. 10, it will be embodied also by the constitution of FIG. 13.

In FIG. 13, a path is provided separating from the path which supplies, from an altering driving power source 5, a driving electric power to the electrode (point c') of a piezoelectric oscillator 1, which is other than the electrode coupled to a ground. On this separating path, an electrostatic capacitance Cs and an amplifier 11, coupled in series with each other, are arranged, and the electrostatic capacitance Cs is coupled to the point c'. Also in this embodiment, the driving voltage V supplied to the electrode of the piezoelectric oscillator 1 is amplified by (N+1) by the amplifier 11, and the amplified output terminal of the amplifier 11 is coupled to the aforementioned point c' via the electrostatic capacitance Cs.

The circuit of FIG. 13 is the same kind of driving apparatus of the piezoelectric oscillator 1 as that of FIG. 10. In the circuit of FIG. 13, supposing that the current supplied from an alternating driving power source 5 to the point c' is i, the current flowing through a series resonance arm be i2, the current flowing through a damping capacitance Cd be i3, and the current flowing through the electrostatic capacitance Cs is i1', the relation between the currents i, i2, i3, and i1' is the same as that where the i1 is replaced with the i1' in the formula (11).

Therefore, also in the driving apparatus of FIG. 13, when the condition expressed by the formula (13) is satisfied, that is, when the condition where the electrostatic capacitance Cs is 1/N times the damping capacitance Cd is satisfied, the current supplied from the driving power source 5 is not consumed by the damping capacitance Cd, and the piezoelectric oscillator can be driven effectively.

Figure 14:
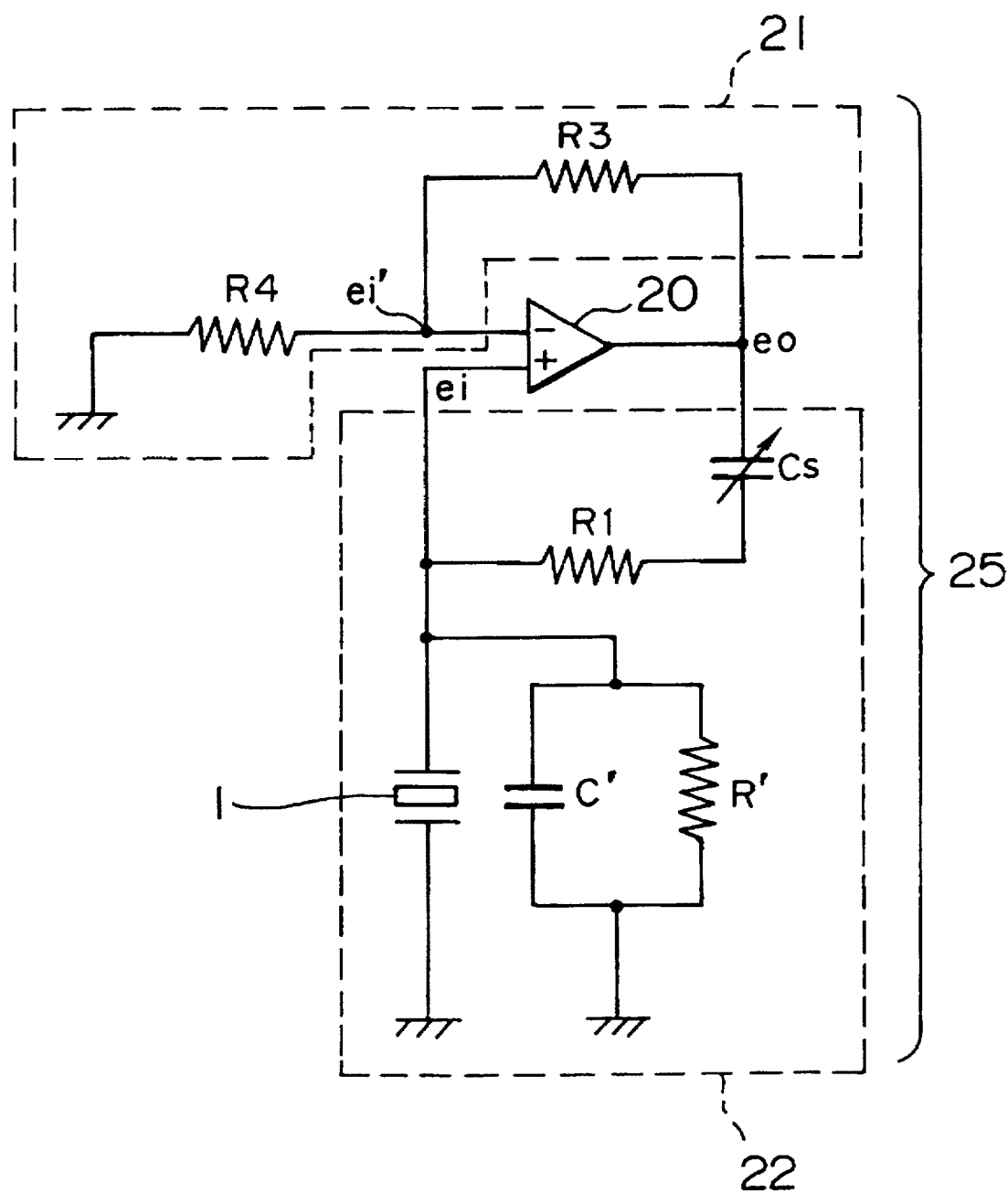
FIG. 14 is a diagram showing an embodiment of the fourth aspect of the present invention.

FIG. 14 shows a circuit diagram of the driving apparatus of a fourth aspect of the present invention.

A negative feedback circuit block 21 and a positive feedback circuit block 22 are coupled to an amplifier (operational amplifier) 20 of a driving circuit 25 for driving the piezoelectric oscillator 1. The negative feedback circuit block 21 is composed of resistors R3 and R4 which determine the gain of the amplifier 20. The positive feedback circuit block 22 is composed of a resistor R1, an electrostatic capacitance Cs, and the piezoelectric oscillator 1.

The negative feedback circuit block 21 serves to set the voltage amplifying gain high of the amplifier 20 to stabilize the amplitude of a self-oscillation. In the negative feedback circuit block 21, a negative feedback path is formed, which extends from the output terminal of the amplifier 20 to the inverting input terminal thereof via the resistor R3. The resistor R4 is coupled to the inverting input terminal of the amplifier 20.

The positive feedback circuit block 22 serves as a frequency selection circuit, wherein one terminal of the piezoelectric oscillator 1 is grounded, the other terminal thereof is coupled to a non-inverting input terminal of the amplifier 20, and a positive feedback path (positive feedback loop) extending from the output terminal of the amplifier 20 to the non-inverting input terminal thereof via the electrostatic capacitance Cs and the resistor R1 is constituted.

Figure 15A:
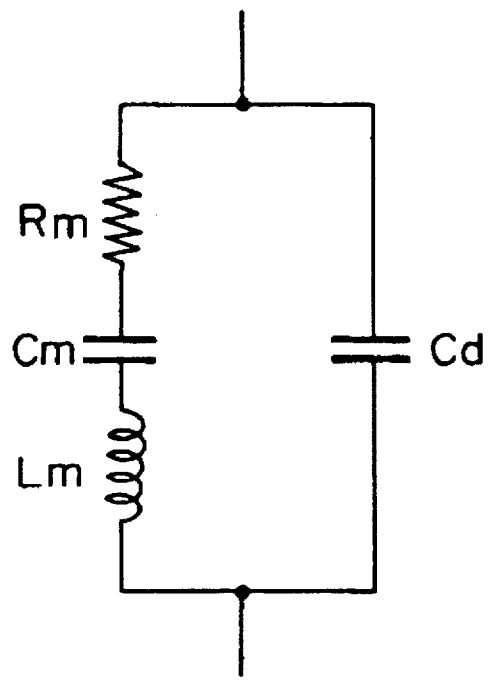
FIG. 15A is an equivalent circuit at the time when a piezoelectric oscillator is driven at a resonance frequency.

FIG. 15A is an equivalent circuit when the piezoelectric oscillator 1 is driven at the resonance frequency fa. At the resonance frequency fa, a reactance Lm and a capacitance Cm constitute a series resonance circuit, and the circuit shown in FIG. 15A is equivalent to the circuit of FIG. 15B. The resonance frequency fa in the equivalent circuit of FIG. 15B can be obtained from the formula (17).

$$fa = \frac{1}{2\pi\sqrt{Lm \cdot Cm}} \tag{17}$$

Figure 15B:
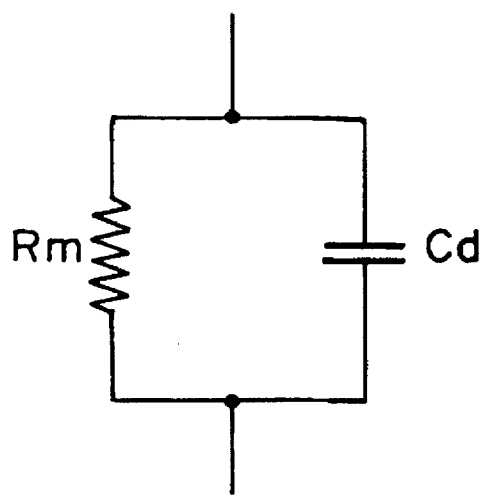
FIG. 15B is an equivalent circuit at the time when the piezoelectric oscillator becomes a series resonance state.

In the circuit illustrated in FIG. 14 wherein it is supposed that an additional capacitance C' and an additional resistor R' are not arranged, the result of the circuit analysis, by replacing the piezoelectric oscillator 1 with the equivalent circuit at the time of the series resonance oscillation shown in FIG. 15B, will be shown below.

Obtaining each of the voltages ei and ei' in FIG. 14 in reference to the voltage eo, the formula (18) is satisfied.

$$ei = \frac{eo}{\left(1 + \frac{R1}{Rm} + \frac{Cd}{Cs}\right) + j\left(\omega CdR1 - \frac{1}{\omega CsRm}\right)} \tag{18}$$

-continued $$ei' = \frac{R4}{R3+R4} \cdot eo$$

When it is assumed that the an amplification factor of the amplifier 20 is large enough, the voltage ei is equal to the voltage ei', and the formula (19) is satisfied.

$$\frac{R4}{R3+R4} = \frac{1}{\left(1+\frac{R1}{Rm}+\frac{Cd}{Cs}\right)+j\left(\omega CdR1 - \frac{1}{\omega CsRm}\right)} \quad (19)$$

The condition concerning the amplitude is expressed in the formula (20), and the condition concerning the frequency is expressed in the formula (21).

$$\frac{R3+R4}{R4} = 1 + \frac{R1}{Rm} + \frac{Cd}{Cs} \quad (20)$$

$$\omega CdR1 = \frac{1}{\omega CsRm} \quad (21)$$

By selecting parameters R1, R3, R4, and Cs satisfying the amplitude condition and the frequency condition, this circuit illustrated in FIG. 14 serves as a self-oscillation circuit.

On the other hand, the frequency condition expressed in the formula (21) means that the damping capacitance Cd is canceled by the electrostatic capacitance Cs and the resistor R1 at the resonance frequency fa of the piezoelectric oscillator 1. Therefore, in FIG. 14, by setting the aforementioned parameters R1, R3, R4, and Cd so as to satisfy the amplitude condition and the frequency condition, the oscillation circuit employing the piezoelectric oscillator 1 can be constituted, as an application of the equivalent reducing circuit of the damping capacitance Cd of the piezoelectric oscillator 1, which is composed of the electrostatic capacitance Cs and the resistor R1.

Specifically, this self-oscillating circuit uses a principle of a Wien bridge circuit. The Wien bridge circuit serves to produce oscillations by applying the positive feedback to the amplifier (operational amplifier) 20. The self-oscillation frequency is determined by the positive feedback circuit block 22 serving as a frequency selection circuit. In the positive feedback circuit block (frequency selection circuit) 22, the first capacitance Cs and the first resistor R1 are coupled in series with each other in the positive feedback loop. The damping capacitance Cd of the piezoelectric oscillator 1 is a second capacitance and the resistor Rm is a second resistor in the equivalent circuit of FIG. 15B. These are arranged in parallel and coupled to the non-inverting terminal of the amplifier 20. In the frequency selection circuit 22, the first capacitance (electrostatic capacitance) Cs serves as a high-pass filter, and the second capacitance (damping capacitance) Cd serves as a low-pass filter. The band-pass filter consisted of the low-pass and high-pass filter disposed on the positive feedback path of the amplifier 20 determines the frequency of the self-oscillation.

The negative feedback circuit block 21 serves to set the voltage amplifying gain of the amplifier 20 and acts as an amplitude stabilizing circuit of the self-oscillation.

The resonance frequency of the piezoelectric oscillator 1 is determined from the formula (17), and it is determined by an inductance component Lm and the capacitance component Cm during a motion period of the piezoelectric oscillator 1. There are some cases where this resonance frequency does not necessarily agree with the self-oscillation frequency determined by the aforementioned frequency selection circuit.

In this case, it should be preferable that in the circuit constituting the piezoelectric oscillator 1 the additional capacitance C' and the additional resistance R' are arranged as shown in FIG. 14 and the respective capacitance value and resistor value are adjusted or selected. At this time, the additional capacitance C' serves to adjust the cut-off frequency of the aforementioned low-pass filter, and the additional resistor R' serves to adjust the cut-off frequency of the aforementioned high-pass filter. As a result, it becomes possible to correct the cut-off frequencies of the low and high-pass filters, so that the self-oscillation frequency of the self-oscillation circuit 25 and the resonance frequency of the piezoelectric oscillator 1 agree with each other or are approximately equal to each other.

Figure 16A:
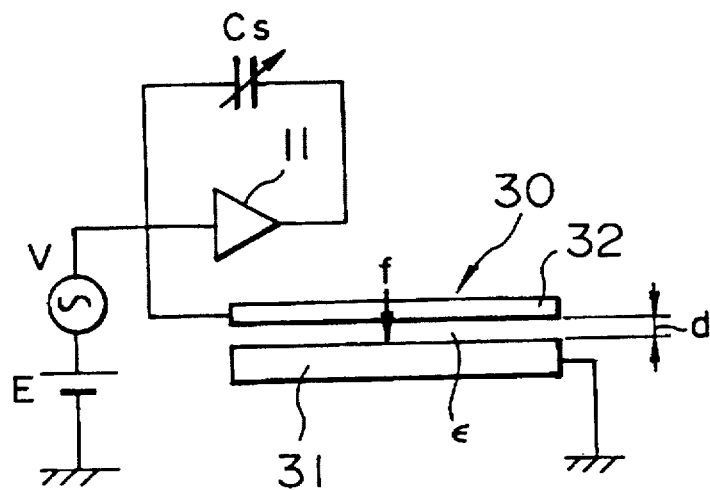
FIG. 16A is a diagram showing a state where an electrostatic converter is driven.
Figure 16B:
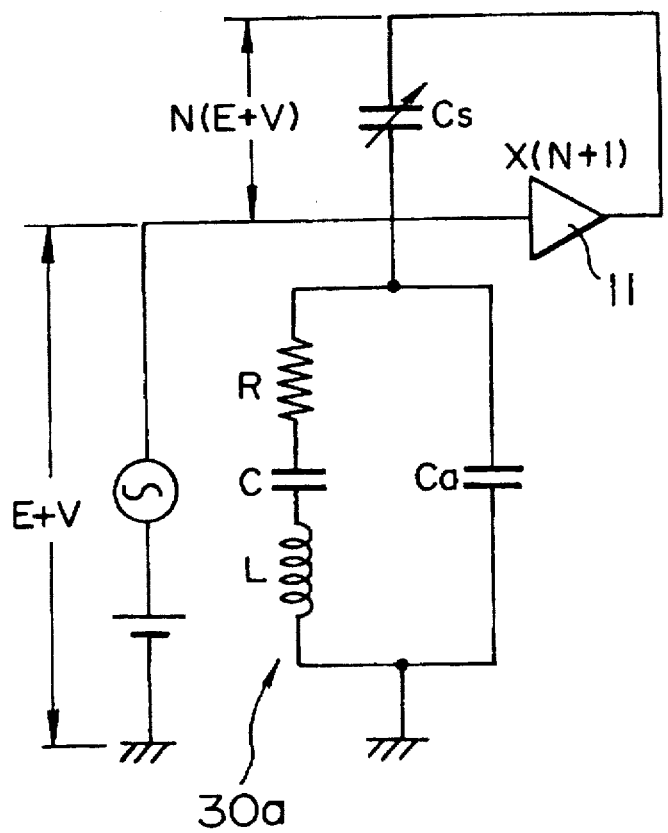
FIG. 16B is an equivalent circuit of FIG. 16A.
Figure 17A:
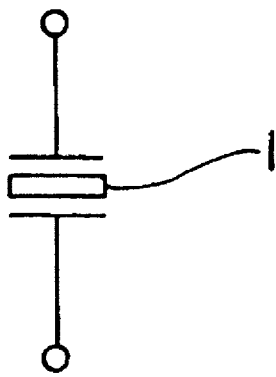
FIG. 17A is a circuit diagram of the piezoelectric oscillator.
Figure 17B:
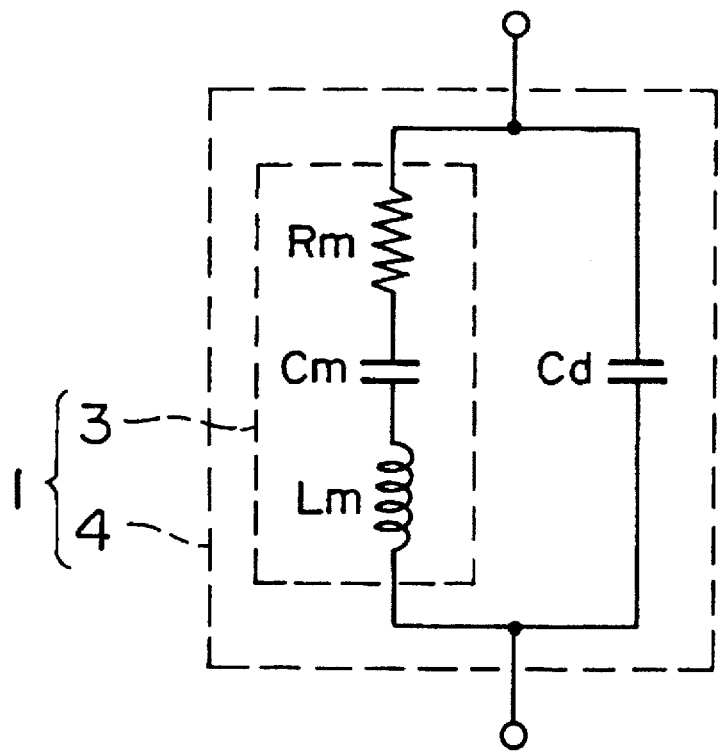
FIG. 17B is an equivalent circuit at the time when the piezoelectric oscillator is driven at a resonance frequency.

Subsequently, in any of the aforementioned embodiments, the piezoelectric oscillator is illustrated as the electrostatic converting means. The piezoelectric oscillator may be employed for the electrostatic converter 30 of the driving apparatus, as shown in FIG. 16A. FIGS. 16A and 16B show the state that the electrostatic converter 30 is driven by the similar circuit to that of the embodiment shown in FIG. 10.

This electrostatic converter 30 has such structure that the fixed flat electrode 31 and the movable electrode 32 face each other with a small distance d. Supposing that areas of the facing electrodes be A; a bias voltage applied between the electrodes, E; the input voltage (driving voltage) applied between the electrodes, V; and dielectric constant of air layer between the electrodes, ε, the electrostatic driving force f acting between the electrodes 31 and 32 due to the input voltage V is expressed by the formula (22).

$$f = \frac{\varepsilon \cdot A \cdot E}{d^2} \cdot V \quad (22)$$

The equivalent circuit is expressed by the reference numeral 30a, at the state where the electrostatic converter 30 is driven. This circuit is equivalent to that when the piezoelectric oscillator performs the oscillation operation at the resonance point as shown in FIG. 10. In FIG. 16B, reference symbol Ca denotes the capacitance component between the electrodes 31 and 32. Furthermore, reference symbol R denotes a mechanical driving resistor of the movable electrode 32; L, a spring constant of the movable electrode 32, mechanically supported; and C, a viscous resistance mechanically and elastically supported. Also in driving of the electrostatic converter 30, the driving current is consumed by the capacitance component Ca, and this consumed quantity is equivalent to the current consumption that does not concern driving of the movable electrode 32.

Therefore, in the embodiment shown in FIGS. 16A and 16B, the same loop circuit as that shown in FIG. 10 is added, the electrostatic capacitance Cs is made 1/N times the capacitance component Ca, and the amplification factor of the amplifier 11 is made (N+1), so that the consumed current at the capacitance component Ca can be reduced and, furthermore, canceled, as in the driving apparatus in the piezoelectric oscillator.

It is noted that the driving circuit where the phase converting means is arranged as shown in FIG. 1 to FIG. 9 and the driving circuit utilizing the self-oscillation shown in FIG. 14 can be used as the driving apparatus of the electrostatic converter 30.

The driving apparatus of the electrostatic converting means of the present invention can be realized as a circuit coupled to a primary terminal of a piezoelectric transformer, or a driving apparatus of a piezoelectric motor. Or else, it maybe used as a driving apparatus for a oscillation type gyroscope and acceleration sensor. In the case of the oscillation type gyroscope a constant elastic material, for example, such as ellinver, is oscillated by a piezoelectric oscillator, or the piezoelectric oscillator itself is oscillated. The constant elastic material or the piezoelectric oscillator is disposed within a rotation system to oscillate them in a different direction from the driving direction by a Coriolis force. The oscillation by the Coriolis force is detected by a piezoelectric element for detection to obtain an angular velocity in the rotation system. It is possible to apply the present invention to the driving apparatus of the aforementioned piezoelectric oscillator for such oscillation type gyroscope.

As described above, according to the present invention, when the electrostatic converting means such as the piezoelectric oscillator is driven, the electric power can be canceled, which is applied to the capacitance component of the electrostatic converting means, so that miniaturization of the driving apparatus can be realized. Furthermore, since an inductance is not employed unlike the conventional driving apparatus, there is no dependency on the frequency in operation of the driving apparatus and easy adjustment can be achieved, as well as miniaturization of the circuit. On the other hand, even in the case where the equivalent cancel condition is not completely satisfied, it is expected that the electric power saving of the driving electric power due to equivalent reducing of the capacitance component can be achieved.

Furthermore, constituting the self-oscillation circuit by the amplifier and the frequency selection circuit, and by incorporating, in this frequency selection circuit, the capacitance component and resistor component of the electrostatic converting means oscillating in the vicinity of the resonance point, it will be possible to drive the electrostatic converting means in the vicinity of the resonance point to achieve the effective driving. By arranging the additional capacitance and the additional resistor, it will be possible to perform the self-oscillation at the frequency equal to the resonance point of the electrostatic converting means or the approximately equal thereto.

Furthermore, by incorporating the resistor for setting the amplification factor in the negative feedback loop of the amplifier, it will be possible to perform the self-oscillation with the stable amplitude.

Although the preferred embodiments of the present invention have been described in detail, it should be understood that various changes, substitutions and alternations can be made therein without departing from spirit and scope of the present inventions as defined by the appended claims.

What is claimed is:

1. A driving apparatus for an electrostatic converter, comprising:
    an oscillating means which is produced by supplying a voltage to one terminal of the electrostatic converter,
    an amplifier having an input terminal connected to said one terminal of said electrostatic converter, the amplifier having an output terminal, and
    an electrostatic capacitance coupled between the output terminal of said amplifier and said one terminal of said electrostatic converter;
    wherein said electrostatic capacitance is approximately 1/N times a capacitance component of said electrostatic converter, and
    wherein a gain of said amplifier is approximately (N+1).

2. A self-oscillation circuit comprising:
    an amplifier having a non-inverting input and an output; and
    a frequency selection circuit including:
        a positive feedback circuit connected between the output and the non-inverting input of the amplifier, and
        an electrostatic converter including a first terminal connected to the positive feedback circuit, and a second terminal connected to a predetermined voltage source;
    wherein a self-oscillation frequency of the self-oscillation circuit is determined by said frequency selection circuit; and
    wherein the amplifier includes an inverting input, and the self-oscillating circuit further comprising a negative feedback circuit including a first resistor connected between the output and the inverting input of the amplifier, and a second resistor connected between the inverting input of the amplifier and the predetermined voltage source.

3. A self-oscillating circuit according to claim 2, wherein the positive feedback circuit includes a resistor and an electrostatic capacitance coupled between the output and the non-inverting input of said amplifier, and the first terminal of said electrostatic converter is coupled to the non-inverting input terminal of the amplifier.

4. A self-oscillating circuit according to claim 2, wherein the predetermined voltage source is a ground potential.

5. A self-oscillating circuit according to claim 2, wherein the electrostatic converter is a piezoelectric oscillator.

6. An apparatus comprising:
    an electrostatic converter having a first terminal connected to an alternating voltage source and a second terminal connected to ground;
    an amplifier having an input terminal connected to the first terminal of the electrostatic converter, the amplifier having an output terminal, and
    an electrostatic capacitance coupled between the output terminal of said amplifier and said first terminal of said electrostatic converter;
    wherein said electrostatic capacitance is approximately 1/N times a damping capacitance component of said electrostatic converter, and
    wherein a gain of said amplifier is approximately (N+1).

* * * * *